(12) United States Patent
Menendez-Nadal et al.

(10) Patent No.: US 10,523,179 B2
(45) Date of Patent: Dec. 31, 2019

(54) ACOUSTIC RESONATOR WITH OPTIMIZED OUTER PERIMETER

(71) Applicant: SnapTrack, Inc, San Diego, CA (US)

(72) Inventors: Oscar Menendez-Nadal, Altamonte Springs, FL (US); Thomas Bain Pollard, Longwood, FL (US); Brian Hal Fisher, Orlando, FL (US); Janardan Nath, Orlando, FL (US)

(73) Assignee: SnapTrack, Inc., San Diego, CA (US)

( * ) Notice: Subject to any disclaimer, the term of this patent is extended or adjusted under 35 U.S.C. 154(b) by 114 days.

(21) Appl. No.: 15/707,458

(22) Filed: Sep. 18, 2017

(65) Prior Publication Data
US 2019/0089332 A1   Mar. 21, 2019

(51) Int. Cl.
| | |
|---|---|
| *H03H 9/13* | (2006.01) |
| *H03H 9/02* | (2006.01) |
| *H03H 9/17* | (2006.01) |
| *H01L 41/314* | (2013.01) |

(52) U.S. Cl.
CPC ........ *H03H 9/132* (2013.01); *H03H 9/02118* (2013.01); *H03H 9/173* (2013.01); *H03H 9/175* (2013.01); *H01L 41/314* (2013.01); *H03H 9/174* (2013.01)

(58) Field of Classification Search
CPC ........ H03H 9/173; H03H 9/132; H03H 9/174; H03H 9/175; H01L 41/314

USPC .......................................... 333/133, 187, 188
See application file for complete search history.

(56) References Cited

U.S. PATENT DOCUMENTS

| | | | | |
|---|---|---|---|---|
| 4,754,187 | A | * | 6/1988 | Kosinski ................. H03H 9/19 310/361 |
| 6,693,500 | B2 | | 2/2004 | Yang et al. |
| 7,211,931 | B2 | | 5/2007 | Nishihara et al. |
| 7,629,865 | B2 | | 12/2009 | Ruby |
| 8,093,962 | B2 | * | 1/2012 | Taniguchi .......... H03H 9/02133 310/365 |
| 9,385,303 | B2 | | 7/2016 | Song et al. |
| 2003/0020564 | A1 | * | 1/2003 | Nishimura ........... H03H 9/0207 333/187 |
| 2009/0009036 | A1 | * | 1/2009 | Matsumoto ........... G01L 9/0022 310/348 |
| 2009/0295507 | A1 | | 12/2009 | Kando et al. |

* cited by examiner

*Primary Examiner* — Robert J Pascal
*Assistant Examiner* — Jorge L Salazar, Jr.
(74) *Attorney, Agent, or Firm* — Colby Nipper/Qualcomm

(57) ABSTRACT

Example implementations of a bulk acoustic wave resonator with an optimized outer perimeter are disclosed. In an example aspect, a resonator includes a truncated-ellipsoid-shaped active region. The active region includes an outer electrode disposed as a first layer of the active region. The active layer also includes a piezoelectric layer disposed as a second layer of the active region with the piezoelectric layer disposed interior to the outer electrode. The active layer further includes an inner electrode disposed as a third layer of the active region with the inner electrode disposed interior to the piezoelectric layer.

27 Claims, 7 Drawing Sheets

ACOUSTIC RESONATOR WITH OPTIMIZED OUTER PERIMETER

TECHNICAL FIELD

This disclosure relates generally to acoustic resonators and, more specifically, bulk acoustic wave resonators.

BACKGROUND

Acoustic resonators (also called "acoustic filters") can be used for filtering high-frequency signal waves. Using a piezoelectric material as a vibrating medium, acoustic resonators operate by transforming an electrical signal wave that is propagating along an electrical conductor into an acoustic signal wave that is propagating via the piezoelectric material. The acoustic signal wave propagates at a velocity having a magnitude that is significantly less than that of the propagation velocity of the electrical signal wave. Generally, the magnitude of the propagation velocity of a signal wave is proportional to a size of a wavelength of the signal wave. Consequently, after conversion of an electrical signal into an acoustic signal, the wavelength of the acoustic signal wave is significantly smaller. The resulting smaller wavelength of the acoustic signal enables filtering to be performed using a smaller filter device. This permits acoustic resonators to be used in electronic devices having size constraints, such as cellular phones and smart watches.

Bulk acoustic wave (also called "BAW" or "volume") resonators are part of a type of acoustic resonators manufactured in a sandwich construction. The sandwich construction includes a piezoelectric material positioned between an overlap of two electrodes in an active region of the BAW resonator. One of the electrodes is coupled to an electrode feed to provide an input signal for filtering. The other of the two electrodes is coupled to another electrode feed for communicating a filtered portion of the input signal to another electrical component.

Unfortunately, an outer perimeter of the BAW resonator facilitates propagation of spurious lateral modes. This occurs because the piezoelectric material is free to oscillate in regions outside of the BAW resonator (e.g., outside of the overlap of the two electrodes). The propagation of spurious lateral modes causes the active region of the BAW resonator to deviate from an optimum vertical vibration (also called a "piston mode"), which causes a loss of energy and a reduction in resonator quality (e.g., a Q-score). Accordingly, designers strive to suppress lateral wave propagation by modifying boundary conditions of the BAW resonator. For example, a BAW resonator may be designed with a frame structure near the outer perimeter of the overlap of the two electrodes to suppress lateral modes. However, a frame structure may reduce electromagnetic coupling of the resonator and the resonator quality.

This background provides context for the disclosure. Unless otherwise indicated, material described in this section is not prior art to the claims in this disclosure and is not admitted to be prior art by inclusion in this section.

SUMMARY

Techniques are disclosed for improving bulk acoustic wave ("BAW") resonators by optimizing an outer perimeter of the resonator. Some of these techniques include providing a scaffold having a quadratic surface upon which a bulk acoustic wave resonator is manufactured. Using microelectromechanical system (MEMs) fabrication techniques, an inner electrode, a piezoelectric material, and an outer electrode are conformally overlaid on the scaffold to create a quadratic-surface-shaped resonator. Using these techniques, an outer perimeter and, consequently, freely oscillating piezoelectric material, is reduced. The techniques reduce spurious mode excitation and energy loss, thereby increasing a quality of the resonator.

In an example aspect, a resonator includes an active region. The active region includes an outer electrode including a first convex portion along a quadratic surface. The active region also includes a piezoelectric layer including a second convex portion with the second convex portion disposed interior to the first convex portion. The active region further includes an inner electrode including a third convex portion with the third convex portion of the inner electrode disposed interior to the second convex portion. The resonator also includes a pedestal coupled to the active region at a connection region. The pedestal includes an outer electrode feed configured to couple the outer electrode to a first electrode feed and an inner layer configured to couple the inner electrode to a second electrode feed.

In another example aspect, a resonator includes a truncated-ellipsoid-shaped active region. The active region includes an outer electrode disposed as a first layer of the active region. The active layer also includes a piezoelectric layer disposed as a second layer of the active region with the piezoelectric layer disposed interior to the outer electrode. The active layer further includes an inner electrode disposed as a third layer of the active region with the inner electrode disposed interior to the piezoelectric layer.

In another example aspect, a method for manufacturing a resonator includes forming a scaffold that includes a quadratic surface and a scaffold pedestal. The method also includes conformally depositing an inner electrode upon the scaffold. The inner electrode includes an active region upon the quadratic surface and a pedestal region upon the scaffold pedestal. The method further includes conformally depositing a piezoelectric material on the inner electrode. The method additionally includes conformally depositing an outer electrode upon the piezoelectric material in the active region and upon the insulating layer in the pedestal region.

In another aspect, a resonator includes a three-dimensional pill-shaped active region. The active region includes an outer electrode disposed as a first layer of the active region and a piezoelectric layer disposed interior to the outer electrode as a second layer of the active region. The active region also includes an inner electrode disposed as a third layer of the active region, the inner electrode disposed interior to the piezoelectric layer.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Overview

Figure 1:
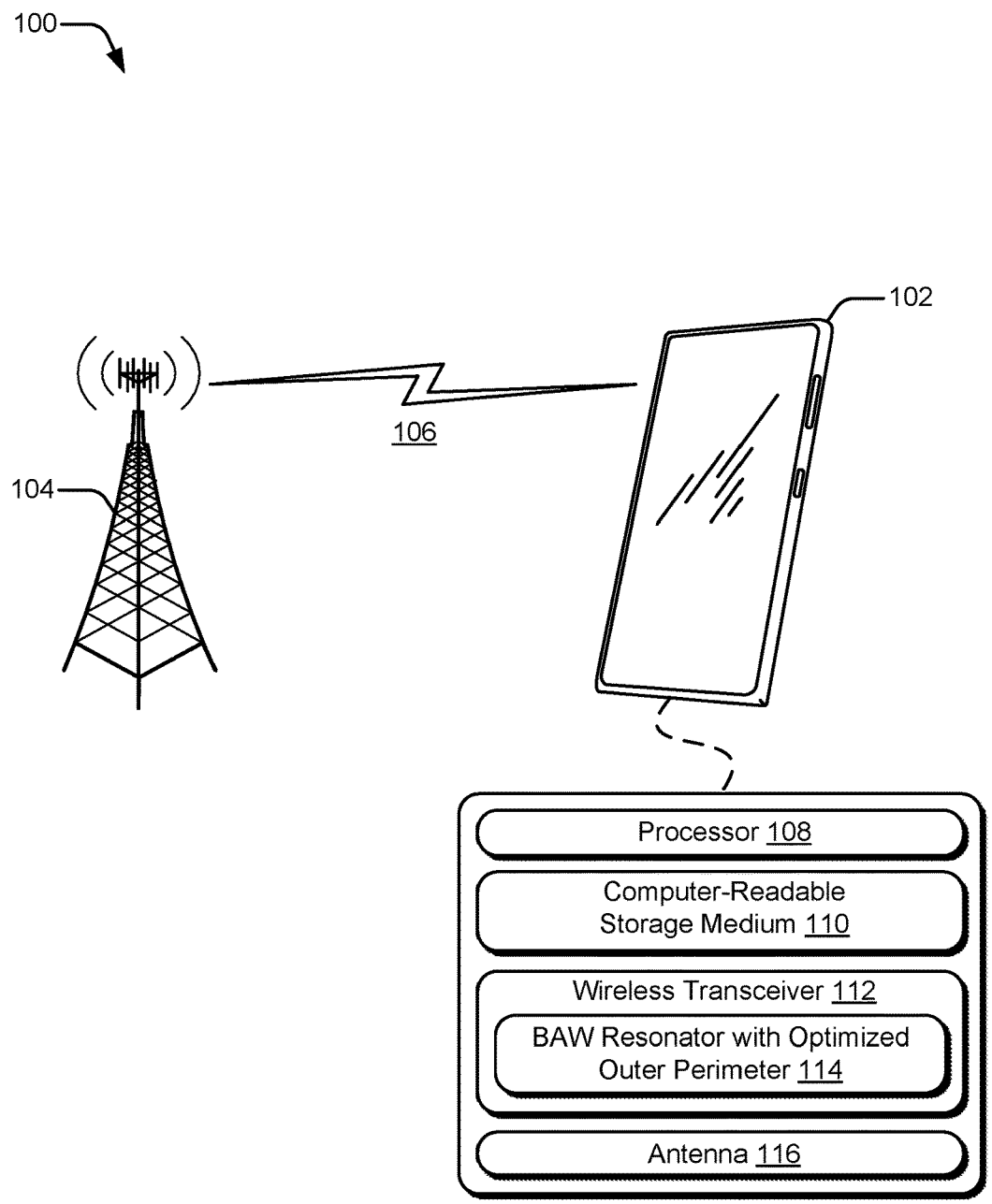
FIG. 1 is an illustration of an example environment for receiving and filtering a wireless signal using a BAW resonator with an optimized outer perimeter according to one or more implementations.

Conventional BAW resonators facilitate propagation of spurious lateral modes based on freely oscillating piezoelectric material in regions outside of the BAW resonator. The conventional BAW resonators are substantially planar and comprise substantially planar layers including a bottom electrode, a piezoelectric layer, and a top electrode. The bottom electrode is positioned below a portion of the piezoelectric layer. The top electrode is positioned above another portion of the piezoelectric layer which partially overlaps the portion of the bottom electrode below which the bottom electrode is positioned. However, additional piezoelectric material is disposed outside of the overlap (at the perimeter), which is free to oscillate and facilitate propagation of spurious lateral nodes. A BAW resonator may implement a frame along the perimeter of the top electrode to suppress lateral nodes; however, the frame may reduce electromagnetic coupling of the resonator and the resonator quality, and is not fully successful at suppressing the lateral nodes.

This document describes example structures and techniques to optimize an outer perimeter of a BAW resonator (hereafter referred to as a "resonator"). The optimized outer perimeter is configured to increase suppression of spurious lateral nodes without substantially reducing electromagnetic coupling of the resonator. The structures include a resonator deposited as layers of a quadratic surface.

An example resonator structure includes a sphere-shaped inner electrode. A piezoelectric material is overlaid upon the inner electrode in a substantially concentric sphere-shaped layer. An outer electrode is overlaid upon the piezoelectric material to form a quadratic-shaped resonator with an optimized outer perimeter. For example, in a fully enclosed sphere, an outer perimeter is substantially eliminated, and spurious lateral wave propagation is substantially reduced. In operation, the inner electrode is coupled to an inner electrode feed, and thus, the resonator is not a fully enclosed sphere. However, the outer perimeter is optimized based on a ratio of a linear length of the outer perimeter to a surface area of an active region in which bulk acoustic waves are propagated between the outer electrode and the inner electrode.

The inner electrode may be coupled to the inner electrode feed via a multi-layered pedestal. The multi-layered pedestal provides structural support to the resonator as well as an inner electrode feed to the inner electrode and an outer electrode feed to the outer electrode. The pedestal may further include the piezoelectric material and an insulating layer to prevent wave propagation in the pedestal and to prevent shorting between the inner electrode feed and the outer electrode feed.

The inner electrode may be a spherical shell. Interior to the inner electrode may be a Bragg mirror having alternating layers of a high-impedance material and a low-impedance material. The Bragg mirror may improve electromagnetic coupling and reduce leaking of acoustic waves from the inner electrode. Alternatively, a volume inside of the inner electrode may be filled with a dielectric material such as silicon dioxide or air. In another alternative configuration, the inner electrode is a solid sphere.

In the following discussion, an example environment is first described that may employ the apparatuses and techniques described herein. Example apparatuses and configurations are then described, which may be implemented in the example environment as well as other environments. Consequently, example apparatuses and configurations are not limited to the example environment and the example environment is not limited to the example apparatuses and configurations. Further, features described in relation to one example implementation may be combined with features described in relation to one or more other example implementations.

FIG. 1 illustrates an example environment 100, which includes a computing device 102 that communicates with a base station 104 through a wireless communication link 106 (wireless link 106). In this example, the computing device 102 is depicted as a smart phone. However, the computing device 102 may be implemented as any suitable computing or electronic device, such as a modem, cellular base station, broadband router, access point, cellular phone, gaming device, navigation device, media device, laptop computer, desktop computer, tablet computer, server, network-attached storage (NAS) device, smart appliance, vehicle-based communication system, and so forth.

The base station 104 communicates with the computing device 102 via the wireless link 106, which may be implemented as any suitable type of wireless link. Although depicted as a tower of a cellular network, the base station 104 may represent or be implemented as another device, such as a satellite, cable television head-end, terrestrial television broadcast tower, access point, peer-to-peer device, mesh network node, fiber optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102 and an uplink of other data or control information communicated from the computing device 102 to the base station 104. The wireless link 106 may be implemented using any suitable communication protocol or standard, such as 3rd Generation Partnership Project Long-Term Evolution (3GPP LTE), IEEE 802.11, IEEE 802.16, Bluetooth™, and so forth.

The computing device 102 includes a processor 108 and a computer-readable storage medium 110 (CRM 110). The processor 108 may include any type of processor, such as an application processor or multi-core processor that is configured to execute processor-executable code stored by the CRM 110. The CRM 110 may include any suitable type of data storage media, such as volatile memory (e.g., random access memory (RAM)), non-volatile memory (e.g., Flash memory), optical media, magnetic media (e.g., disk or tape), and so forth. In the context of this disclosure, the CRM 110 is implemented to store instructions, data, and other information of the computing device 102, and thus does not include transitory propagating signals or carrier waves.

A wireless transceiver 112 of the computing device 102 provides connectivity to respective networks and other electronic devices connected therewith. Additionally or alternatively, the computing device 102 may include a wired transceiver, such as an Ethernet or fiber optic interface for communicating over a local network, intranet, or the Internet. The wireless transceiver 112 may facilitate communication over any suitable type of wireless network, such as a wireless LAN (WLAN), peer-to-peer (P2P) network, mesh network, cellular network, wireless wide-area-network (WWAN), and/or wireless personal-area-network (WPAN). In the context of the example environment 100, the wireless transceiver 112 enables the computing device 102 to communicate with the base station 104 and networks connected therewith.

The wireless transceiver 112 includes a BAW resonator with an optimized outer perimeter 114 for filtering signals received or transmitted via the wireless link 106. The BAW resonator with an optimized outer perimeter 114 may be used, for example, as an element of a duplexer for filtering during transmitting and receiving data and/or signals via an antenna 116. In a receiving operation, the antenna 116 receives multiple signals transmitted via one or more wireless networks, such as from the base station 104. The multiple signals can include signals having various frequencies and intended for various devices. The antenna 116 is coupled to the duplexer including the BAW resonator with an optimized outer perimeter 114 to perform filtering of the multiple signals. The BAW resonator with an optimized outer perimeter 114 may select signals within a specified passband and reject frequencies outside of the passband. The selected signals are then passed, via an output terminal of the BAW resonator with an optimized outer perimeter 114, to another component of the computing device 102 for further processing.

Figure 2:
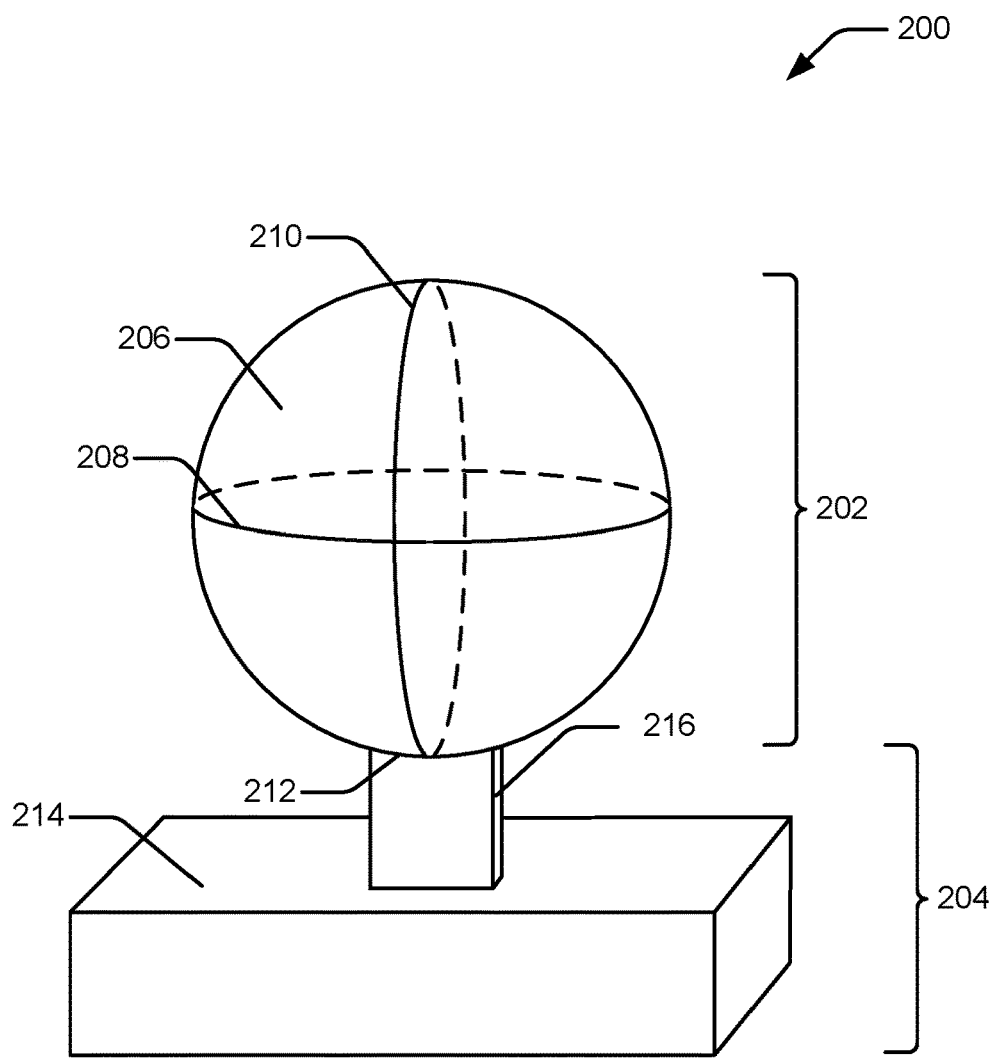
FIG. 2 is a perspective view of an example configuration of a resonator having an optimized outer perimeter according to one or more implementations.

FIG. 2 is a schematic view of an example of a resonator 200 with an optimized outer perimeter for filtering signals and selecting signals within a specified passband. The resonator 200 includes an active region 202 and a pedestal region 204. The active region 202 includes a quadratic surface 206 that is coupled to the pedestal region 204 at a connection region 212. The quadratic surface 206 is a volumetric shape and is illustrated as a truncated ellipsoid with cross-sectional planes 208 and 210 shown for reference purposes. The truncated ellipsoid may include one or more foci or a center of curvature. The pedestal region 204 includes a base 214 and a stand 216 that couples to the quadratic surface 206 at the connection region 212. The connection region 212 can be free of parallel edges to reduce constructive interference of reflected lateral waves, if any.

The active region 202 includes a BAW resonator configuration with a piezoelectric material positioned between an inner electrode and an outer electrode. Although the quadratic surface 206 is illustrated as a truncated ellipsoid, the quadratic surface 206 may instead be implemented to include other full or truncated volumetric shapes. These full or truncated volumetric shapes can, in some examples, have a continuous and smooth quadratic surface. For example, the quadratic surface 206 may be implemented as an ellipsoid, a hyperboloid, an ovoid, a rounded rectangular prism, a pill-shape, a peanut-shape, or another volumetric shape having alternating concave regions and convex regions. The quadratic surface may be truncated at the connection region 212 to allow the connection region 212 to provide the inner electrode with an electrical connection to a terminal outside of the active region 202. The connection region 212 may be planar or another quadratic surface. The connection region 212 may also have layers corresponding to one or more of the outer electrode, the piezoelectric layer, and the inner electrode.

In some implementations, the quadratic surface 206 is free of pointed edges and corners to reduce abrupt variation in thicknesses and direction of the layers and a likelihood of cracks or other imperfections in the piezoelectric material. The quadratic surface 206 may also include a shell of a partially or fully enclosed structure where the outer electrode is exterior to the piezoelectric material in the active region 202. For example, the quadratic surface 206 may be implemented as a hemisphere that is a partially enclosed structure having a low ratio of a linear length of the outer perimeter to a surface area of an active region when compared with a conventional, planar resonator. Additionally or alternatively, the quadratic surface 206 includes multiple regions that are three-dimensionally convex. The quadratic surface may include a convex portion having a center of curvature, a focus, or multiple foci. Thus, interior to the convex portion may be defined as a volume between the convex portion of the quadratic surface and the center of curvature, the focus, or one of the multiple foci.

The piezoelectric layer 304 may include or be formed of aluminum nitride, quartz crystal, gallium orthophosphate, or a lithium-based material. Furthermore, the piezoelectric layer 304 may be doped, sized, and/or cut at various angles to modify propagation, coupling, or other signal attributes that arise from different material characteristics.

Figure 3:
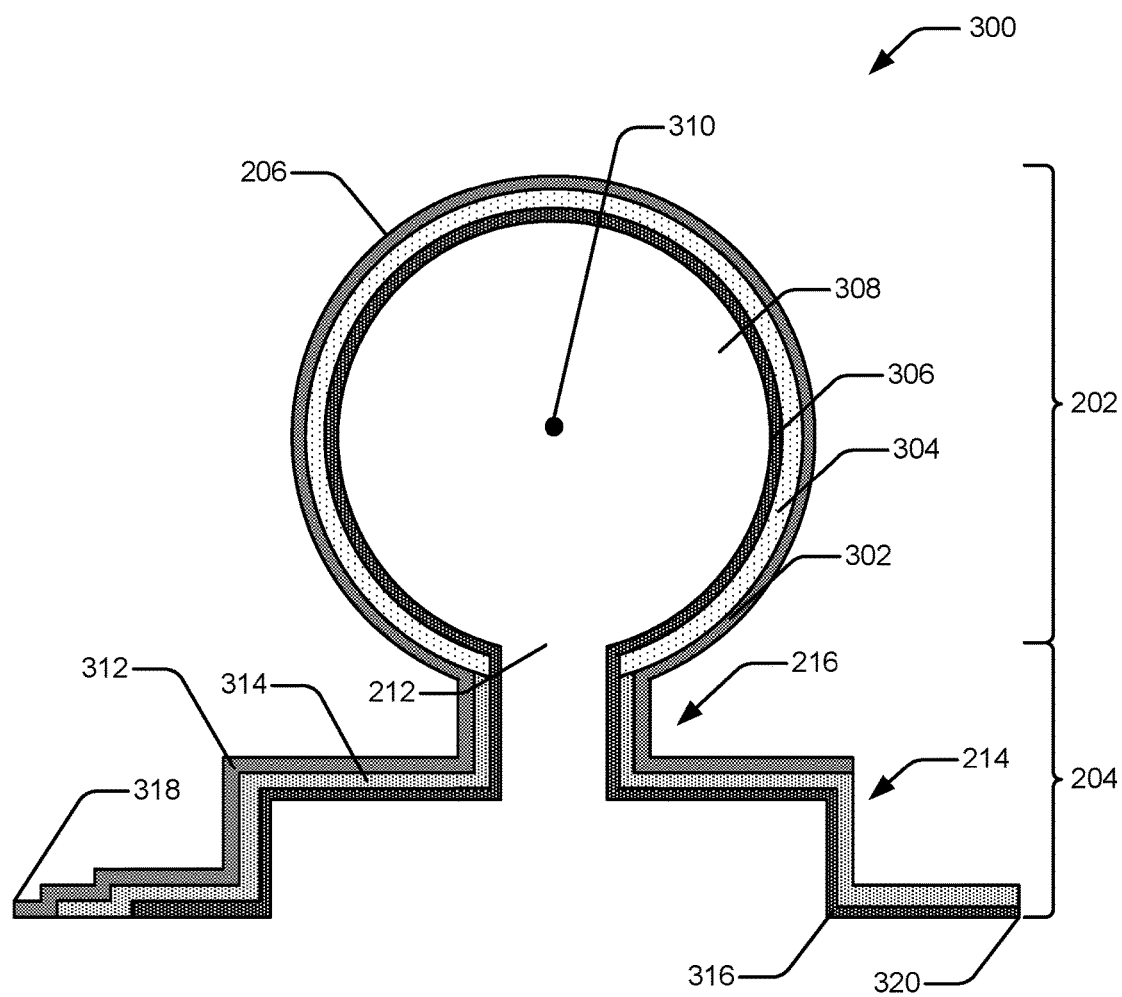
FIG. 3 is a side cross-sectional view of another example configuration of a resonator having an optimized outer perimeter according to one or more implementations.

FIG. 3 illustrates a cross-section of an example resonator 300 with an optimized outer perimeter. The cross-section shows the resonator 300 as viewed in the cross-sectional plane 210 of FIG. 2. The resonator 300 includes an active region 202 having a quadratic surface 206, an outer electrode 302, a piezoelectric layer 304, an inner electrode 306, and an interior volume 308. One or more of the outer electrode 302, the piezoelectric layer 304, and the inner electrode 306 have a center of curvature 310. In other implementations (e.g., when the quadratic surface includes a portion of an ellipsoid, a paraboloid, or a hyperboloid), one or more of the outer electrode 302, the piezoelectric layer 304, and the inner electrode 306 have one or more foci.

The resonator 300 also includes a pedestal region 204 having a base 214 and a stand 216. The active region 202 and the pedestal region 204 are coupled at a connection region 212. The pedestal region 204 includes an outer electrode feed 312, an insulation layer 314, and an inner electrode feed 316. The outer electrode feed 312 electrically couples the outer electrode 302 to a terminal 318. The inner electrode feed 316 couples the inner electrode 306 to another terminal 320. The terminal 320 may be an input terminal to provide an input signal to the inner electrode. Alternatively, the terminal 320 may be an output terminal to receive an output signal from the inner electrode 306. One or more of the terminals 318 or 320 may be coupled to another resonator. As such, an output terminal (one of terminals 318 or 320) of the resonator 300 is coupled to an input terminal of another resonator. Additionally or alternatively, an input terminal (the other of terminals 318 or 320) of the resonator 300 may be coupled to an output terminal of another resonator.

The inner electrode 306 and the outer electrode 302 may include one or more same materials. For example, both of the inner electrode 306 and the outer electrode 302 may include tungsten as a current-carrying material and/or an interface material for coupling to the piezoelectric layer 304. The outer electrode 302 may include additional materials such as silicon dioxide and/or silicon nitride to insulate the outer electrode 302 from an outer environment and enhance coupling to the piezoelectric layer 304. As such, the outer electrode may be defined as any material exterior to the piezoelectric layer 304 in the active region 202. The outer electrode 302 may also include a frame region that circumscribes, or partially surrounds, the connection region 212 to provide additional lateral wave suppression. The frame region may include a region of the outer electrode 302 having a thickness that is greater than a thickness of the outer electrode 302 outside of the frame region.

The insulation layer 314 is configured to reduce a likelihood of shorting between the outer electrode 302 and the inner electrode 306. However, to reduce a likelihood of shorting in other implementations, the outer electrode feed 312 may be disposed on a first side surface of the base 214 (such as the left side surface in FIG. 3), a portion of a top surface of the base 214 adjacent to the first side surface, and a portion of the stand 216 adjacent to the portion of the top surface. Additionally, the inner electrode feed 316 may be disposed on a second side surface of the base 214 (such as the right side surface in FIG. 3), another portion of the top surface of the base 214 adjacent to the second side surface, and another portion of the stand 216 adjacent to the other portion of the top surface.

The pedestal region 204 may be filled with air, silicon dioxide, or another dielectric. Alternatively, the pedestal region 204 may be filled with conductive material, such as tungsten, copper, gold, aluminum or graphene. The pedestal region 204 may include regions that are free of the inner electrode feed 316, the insulation layer 314, and the outer electrode feed 312 to allow access to an interior of the stand 216 and the interior volume 308 during a manufacturing process.

Figure 4:
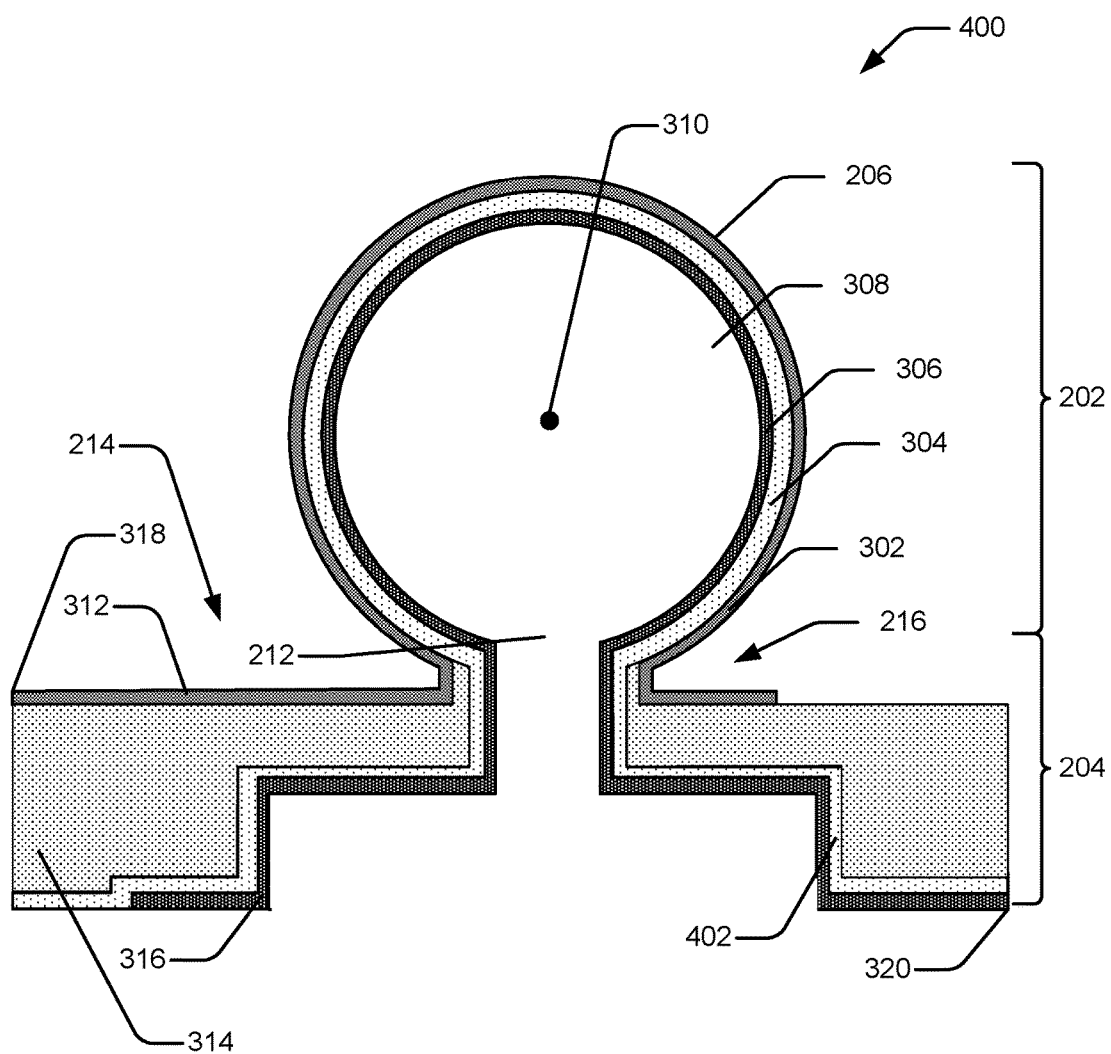
FIG. 4 is a side cross-sectional view of another example configuration of a resonator having an optimized outer perimeter according to one or more implementations.

FIG. 4 illustrates a cross-section of another example resonator 400 with an optimized outer perimeter. The cross-section shows the resonator 400 as viewed in the cross-sectional plane 210 of FIG. 2. The resonator 400 includes an active region 202 having a quadratic surface 206 an outer electrode 302, a piezoelectric layer 304, an inner electrode 306 and an interior volume 308. One or more of the outer electrode 302, the piezoelectric layer 304, and the inner electrode 306 have a center of curvature 310. The active region 202 couples to a pedestal region 204 at a connection region 212. The pedestal region includes a base 214 stand 216. The pedestal region 204 includes an outer electrode feed 312, an insulation layer 314, additional piezoelectric material 402, and an inner electrode feed 316.

At the connection region 212, one or more of the materials forming the outer electrode 302, the piezoelectric layer 304, and the inner electrode 306 may be rotated about an angle. The piezoelectric layer 304 and the additional piezoelectric material 402 may meet at a corner within the connection region 212. This may result in a variation of thickness and a non-smooth surface of the piezoelectric layer 304 and the additional piezoelectric material 402 at the connection region 212. The non-smooth surface at the connection region 212 increases a likelihood of cracks or other imperfections in the piezoelectric material. Even if the surface is smooth at the connection region 212, rotating about the angle in a smooth transition may still result in an increased likelihood of cracks or other imperfections in the piezoelectric material if a radius of curvature is small (e.g. smaller than a radius of curvature of the piezoelectric layer 304 in the active region 202).

To reduce coupling beyond the connection region 212, the insulation layer 314 is disposed between the outer electrode feed 312 and the inner electrode feed 316. As illustrated, the insulation layer 314 may be disposed between the additional piezoelectric material 402 and the outer electrode feed 312. Alternatively, the insulation layer 314 may be disposed between the inner electrode feed 316 and the additional piezoelectric material 402.

Figure 5:
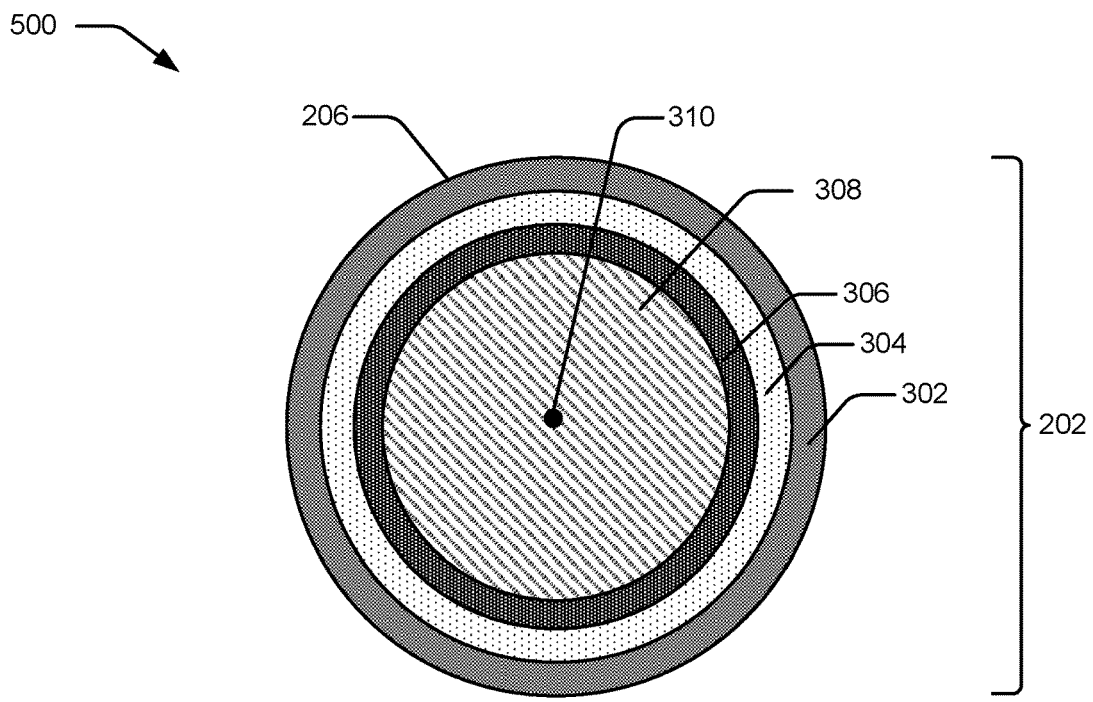
FIG. 5 is a top cross-sectional view of another example configuration of a resonator having an optimized outer perimeter according to one or more implementations.

FIG. 5 illustrates a cross-section of another example resonator 500 with an optimized outer perimeter. The cross-section shows the resonator 500 as viewed in the cross-sectional plane 208 of FIG. 2. The resonator 500 includes an outer electrode 302, a piezoelectric layer 304, an inner electrode 306, and an interior volume 308. As shown, the outer electrode 302, the piezoelectric layer 304, and the inner electrode 306 include substantially concentric layers of the resonator 500 that are substantially similar to the quadratic surface 206. Thus, the outer electrode 302, the piezoelectric layer 304, and the inner electrode 306 have a same center of curvature 310. Furthermore, one or more of the outer electrode 302, the piezoelectric layer 304, and the inner electrode 306 may have a substantially uniform radial thickness in the active region 202. Additionally or alternatively, a variation in a radial thickness of the piezoelectric layer 304 may be calibrated to a bandwidth of frequencies to be selected by the resonator 500. The variation of the radial thickness of the piezoelectric layer 304 may be slight to be calibrated to the bandwidth of the frequencies to be selected by the resonator 500. For example, the variation may be less than less than 5%, or less than 2% to be calibrated to the bandwidth of the frequencies to be selected by the resonator 500. The calibration may be based on calculated imperfections in the quadratic surface 206 from manufacturing process, or based on design.

The interior volume 308 may be filled with air or silicon dioxide or another dielectric material to provide acoustic insulation for the inner electrode 306. Alternatively, the interior volume 308 may be filled with a same material included in the inner electrode 306, such as tungsten, aluminum, or copper. Filling the interior volume 308 with a same material included in the inner electrode 306 provides a structural support to the active region and may reduce an electrical resistance of the inner electrode 306. In other implementations, the interior volume 308 comprises a scaffold upon which the inner electrode 306 is disposed during manufacturing. The scaffold may be formed into a shape having an exterior surface similar to the quadratic surface 206 of the active region such that the inner electrode 306, the piezoelectric layer 304, and the outer electrode 302 may be conformally deposited, one after another, to create the active region 202 of the resonator 500. In some implementations, after conformally depositing the inner electrode 306, the piezoelectric layer 304, and the outer electrode 302, at least a portion of the scaffold is removed. After removal of the scaffold, the inner volume may be filled with another material, such as a dielectric. The scaffold may be, for example, SU-8 or another negative photoresist material.

Figure 6:
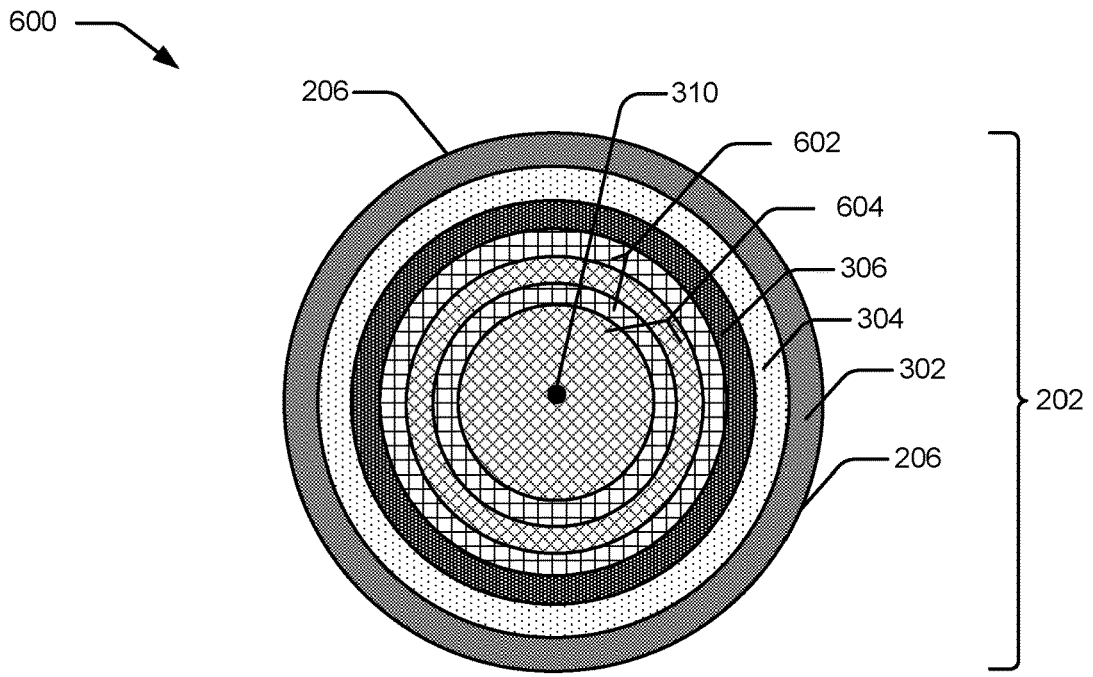
FIG. 6 is a top cross-sectional view of another example configuration of a resonator having an optimized outer perimeter according to one or more implementations.

FIG. 6 illustrates a cross-section of another example resonator 600 with an optimized outer perimeter. The cross-section shows the resonator 600 as viewed in the cross-sectional plane 208 of FIG. 2. The resonator 500 includes an outer electrode 302, a piezoelectric layer 304, and an inner electrode 306 having a same radius of curvature 310. Interior to the inner electrode 306, alternating layers of a low-impedance material 602 and a high-impedance material 604 are disposed as a Bragg mirror.

The Bragg mirror reflects acoustic waves that have penetrated the inner electrode 306 such that the penetrating acoustic waves are redirected back toward the inner electrode 306 for coupling. The alternating layers of low-impedance material 602 and high-impedance material 604 may further be disposed around an interior structure, such as the scaffold described relative to FIG. 5. The high-impedance material 604 may include a metallic material such as tungsten, titanium, gold, or platinum which provide high acoustic impedance. The low-impedance material may include a dielectric material such as silicon dioxide or other silicon-based material. Alternatively, the low-impedance material may include a conductive material such as aluminum, aluminum copper alloy, magnesium, or magnesium alloy.

Figure 7:
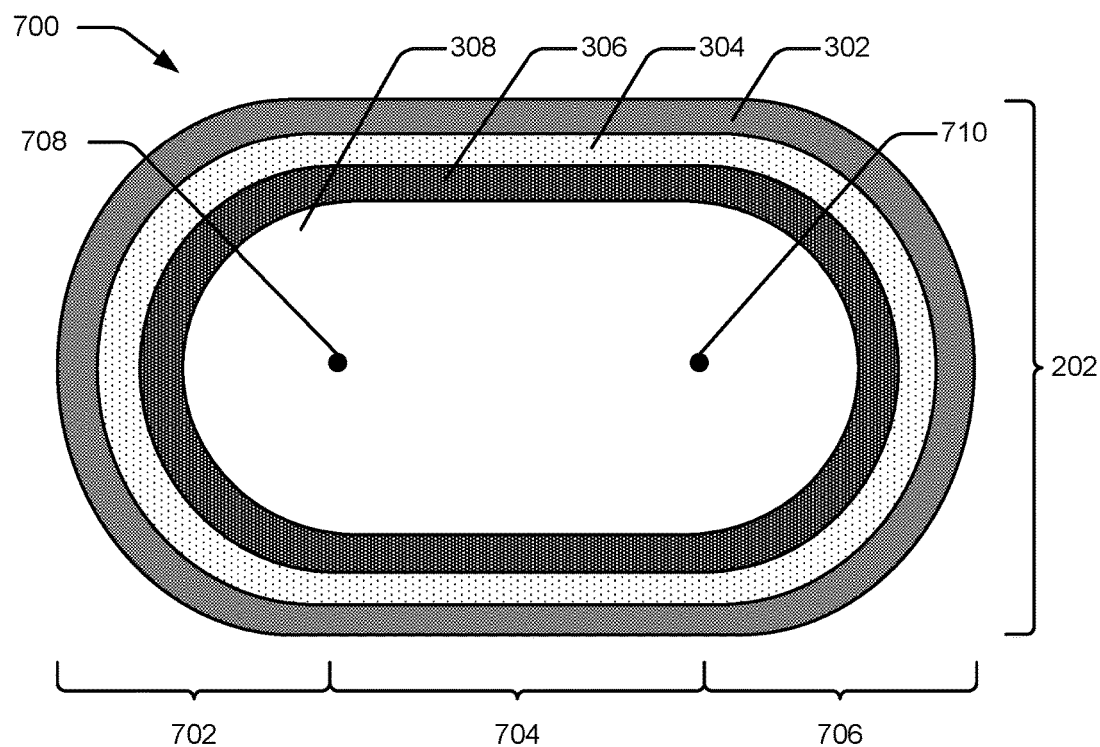
FIG. 7 is a top cross-sectional view of another example configuration of a resonator having an optimized outer perimeter according to one or more implementations.

FIG. 7 illustrates a cross-section of another example resonator 700 with an optimized outer perimeter. The cross-section shows the resonator 700 as viewed in the cross-sectional plane 208 of FIG. 2. The active region 202 of the resonator 600 includes substantially concentric layers of an outer electrode 302, a piezoelectric layer 304, and an inner electrode 306. The inner electrode 306 defines an interior volume 308. The active region 202 also includes a rounded portion 702, a body portion 704, and another rounded portion 706. The rounded portion 702 has a center of curvature 708 and the rounded portion 710 has a center of curvature 710. The rounded portions 702 and 706 define longitudinal ends of the body portion 704.

The active region 202 may have a three-dimensional pill-shape with the rounded portions 702 and 706 including a three-dimensionally convex portion and the body portion 704 being shaped to smoothly connect the round portions 702 and 706 and the body portion 704 having a smooth-shaped cross-section in a latitudinal plane. For example, the body portion may be a cylinder shape or a frustoconical shape having ellipse-shaped cross-sections. Alternatively, the body portion may have an irregular smooth-shaped cross-section including a convex portion and a concave portion. The rounded portions 702 and 706 may be shaped as truncated spheres, a truncated ellipsoid, a paraboloid, a hyperboloid, or another volumetric quadratic surface. The cylinder-shaped body portion 704 may be truncated, or planarized, at a lower surface for connecting to a pedestal region 204 (not shown) at a connection region 212 (not shown). Additionally, the body portion 704 may be coupled to one or more additional pedestals to facilitate forming the active region into the pill shape of the resonator 700. The one or more additional pedestals may provide additional structural support or additional electrode feeds.

The active region 202 may be designed to provide a slight variation of thickness in one or more of the rounded portion 702, the body portion 704, and the other rounded portion 706. For example, the active region 202 may be calibrated to select frequencies within a specified bandwidth based on a variation of thickness between the three-dimensionally convex regions of the rounded portions 702 and 704, and the cylinder-shaped body portion 704.

The interior volume 308 may be filled with air, silicon dioxide, or another dielectric to provide acoustic insulation for the inner electrode 306. Alternatively, the interior volume 308 may be filled with a same material included in the inner electrode 306, such as tungsten, aluminum, or copper.

Figure 8:
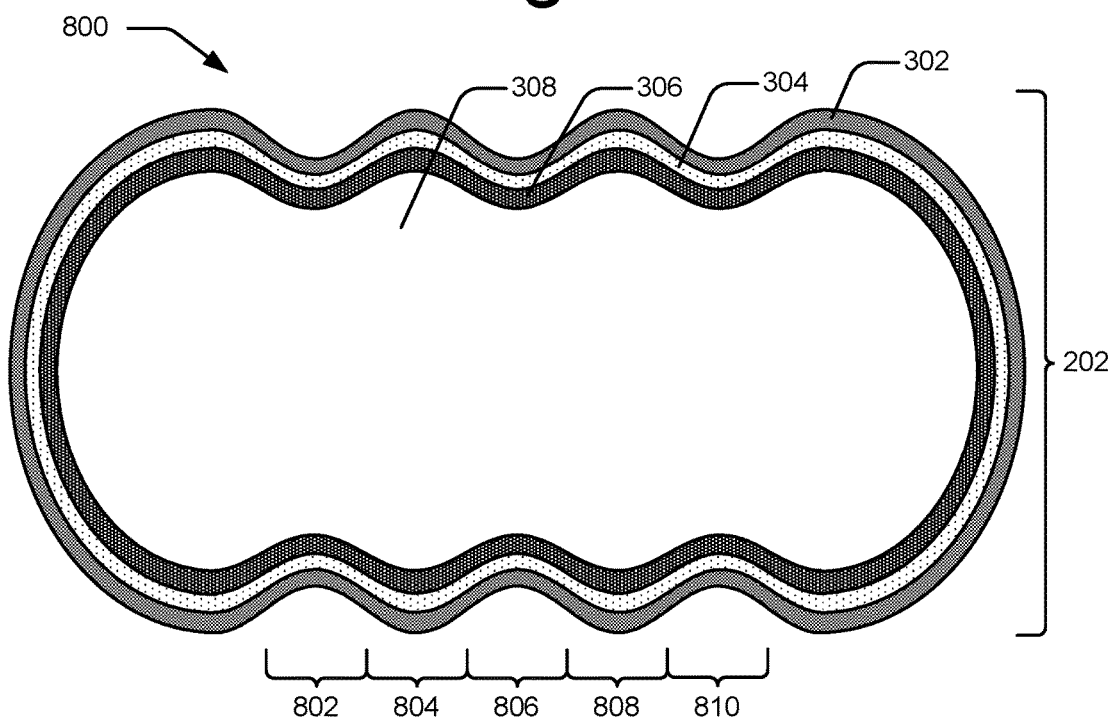
FIG. 8 is a top cross-sectional view of another example configuration of a resonator having an optimized outer perimeter according to one or more implementations.

FIG. 8 illustrates a cross-section of another example resonator 800 with an optimized outer perimeter. The cross-section shows the resonator 800 as viewed in the cross-sectional plane 208 of FIG. 2. The active region 202 of the resonator 600 includes substantially concentric layers of an outer electrode 302, a piezoelectric layer 304, and an inner electrode 306. The inner electrode 306 defines an interior volume 308.

The active region 202 includes a first concave region 802, a first convex region 804, a second concave region 806, a second convex region 808, and a third concave region 810 forming a body portion of the active region 202. The surfaces 802, 804, 806, 808, and 810 alternate to form a collective surface that is smooth and continuous. The surfaces 802, 804, 806, 808, and 810 may each have respective centers of curvature or foci. Alternatively, the surfaces 802, 804, 806, 808, and 810 may each have multiple centers of curvature or foci for different portions of the respective surfaces 802, 804, 806, 808, and 810. The first concave region 802, the second concave region 806, and the third concave region 810 each may have one or more centers of curvature or foci exterior to the body portion of the active region 202. Additionally, the first convex region 804 and the second convex region 808 each may have one or more centers of curvature or foci interior to the body portion of the active region 202.

The surfaces 802, 804, 806, 808, and 810 may collectively form a sinusoidal surface that wraps transversely around the active region 202. For example, the active region 202 may be a ribbed pill shape or a truncated, ribbed pill shape. The active region 202 may be truncated or planarized at the connection region 212 (not shown). Additionally, the active region 202 may be coupled to one or more additional pedestals to facilitate the ribbed pill shape of the resonator 800. The one or more additional pedestals are spaced from the first pedestal and may provide additional structural support or additional electrode feeds.

The surfaces 802, 804, 806, 808, and 810 provide a relatively small footprint of the resonator 800 with a large interface surface area between the inner electrode 306, the piezoelectric layer 304 and the outer electrode 302. This allows for an increased effective surface area of the resonator 800 for filtering signals while minimizing a footprint of the resonator 800. Furthermore, an alternating curvature of the surfaces 802, 804, 806, 808, and 810 provide a smooth and continuous piezoelectric layer 304. The smooth and continuous piezoelectric layer 304 is less likely to crack or include other imperfections than if the piezoelectric layer 304 were not smooth.

The interior volume 308 may be filled with air, silicon dioxide, or another dielectric to provide acoustic insulation for the inner electrode 306. Alternatively, the interior volume 308 may include alternating layers of a low-impedance material 602 and a high-impedance material 604 disposed as a Bragg mirror, as discussed relative to the resonator 600 of FIG. 6.

Figure 9:
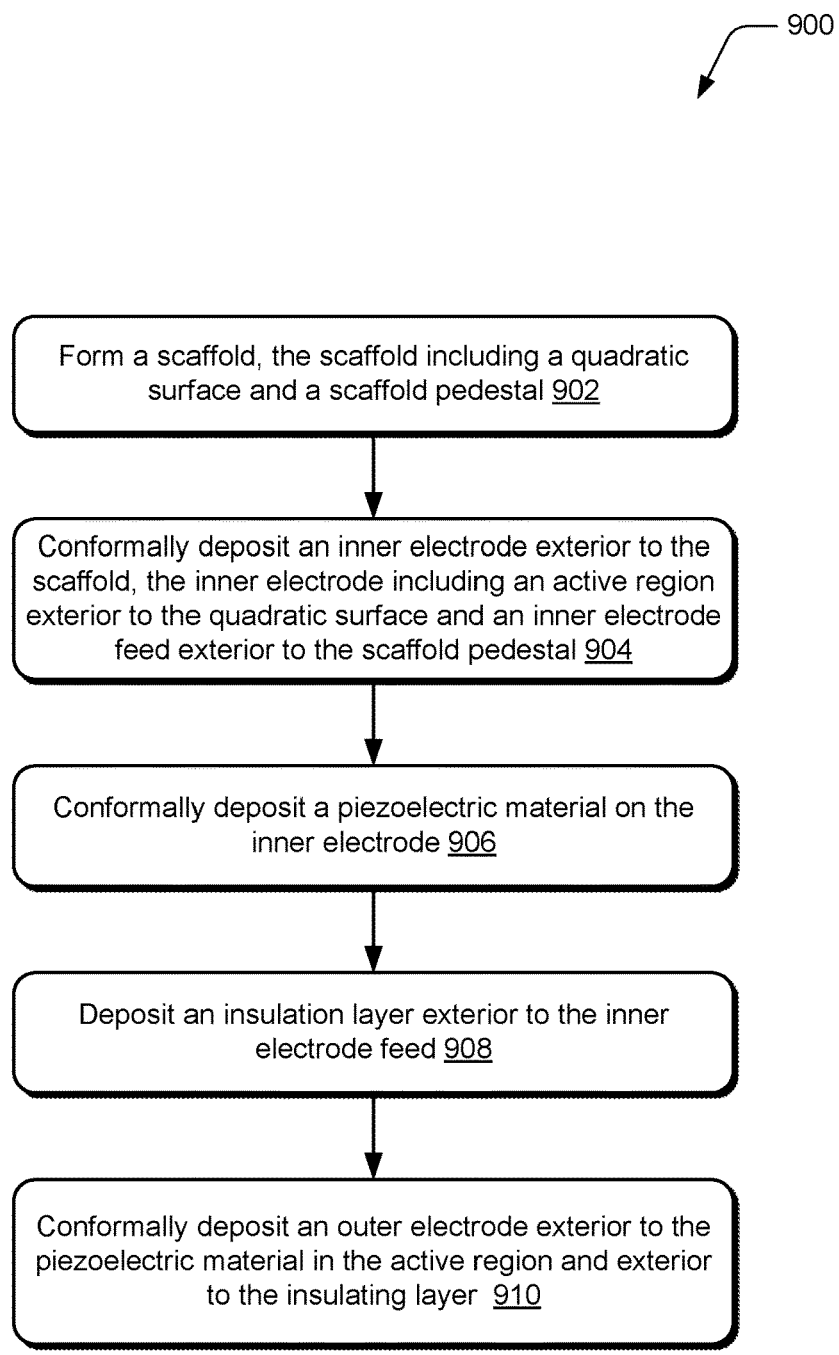
FIG. 9 is a flow diagram that depicts example operations for forming a resonator having an optimized outer perimeter according to one or more implementations.

FIG. 9 is a flow diagram 900 that describes example operations for forming a BAW resonator with an optimized outer perimeter. At operation 902, a scaffold is formed including a quadratic surface and a scaffold pedestal. For example, the scaffold may be shaped as the interior volume 308 and a volume inside of the inner electrode feed 316 of FIG. 3. The scaffold may be constructed on a substrate using micro-electro-mechanical systems (MEMS) manufacturing procedures.

In an example MEMS manufacturing procedure, the scaffold pedestal is formed by depositing and etching layers of scaffolding material in a desired shape. The scaffolding material may include SU-8 or another hydrophobic material. The scaffold pedestal may include multiple layers that include a base layer and a stand layer. The base layer and/or the stand layer may include, or be formed as, a polygonal prism, a cylinder, or another shape that provides elevation from the substrate. A layer of another material is deposited to have a top surface that is substantially coplanar with a top surface of the scaffolding pedestal. The other material may be hydrophilic, such as silicon dioxide. Another layer of the scaffolding material is deposited such that a bottom surface of the other layer of the scaffolding is in contact with a top surface of the scaffolding pedestal and a portion of the top surface of the other material. Thus, the other layer of the scaffolding material is wider than the scaffolding pedestal. In some implementations, the other layer of the scaffolding material has a width that is greater than double a width of the scaffolding pedestal Heat is applied to the other layer of the scaffolding material to bring the scaffolding material to a transition temperature, which causes rounding of the other layer. The heating is used to round edges and corners and form the other layer into a shape having an exterior surface that includes the quadratic surface. The other material is then removed to expose the scaffold pedestal. In some implementations, such as a method for manufacturing the resonator 600 of FIG. 6, the method includes an intermediate step of conformally depositing alternating layers of the high-impedance material 604 and the low-impedance material 602 on the exterior surface of the other layer of the scaffolding pedestal.

At operation 904, an inner electrode is conformally deposited exterior to the scaffold. The inner electrode includes an active region exterior to the quadratic surface and an inner electrode feed exterior to the scaffolding pedestal. For example, the inner electrode 306 is disposed in the active region 202 and the inner electrode feed 316 is disposed in the pedestal region 204. The scaffold may be removed after the inner electrode is conformally deposited. This may be performed by etching one or more side surfaces of the inner electrode feed that are deposited on the base of the scaffold pedestal. After etching the one or more side surfaces of the inner electrode feed, the scaffold material may be removed though wet etching and/or dry etching to leave the inner electrode substantially hollow. The inner electrode may be back-filled with another material to implement one or more example resonators discussed above. For example, the inner electrode may be back-filled with silicon dioxide.

At operation 906, a piezoelectric material is conformally deposited on the inner electrode. For example, the piezoelectric layer 304 and the additional piezoelectric material 402 are conformally disposed on the inner electrode 306 and the inner electrode feed 316. In some implementations, the additional piezoelectric material 402 is removed from the pedestal region 204 using MEMS manufacturing processes. In other implementations, the additional piezoelectric material 402 is prevented from coupling to the inner electrode feed using MEMS manufacturing processes. Removing the additional piezoelectric material 402 from the inner electrode feed 316, or preventing coupling to the inner electrode feed 316, reduces a likelihood of lateral waves from propagating through the connection region 212. This may improve a quality of the resonator 300 because the connection region 212 would otherwise have an increased likelihood of having a crack or other imperfection in the piezoelectric layer 304.

At operation 908, an insulation layer is deposited exterior to the inner electrode feed. For example, the insulation layer 314 may be conformally deposited on the inner electrode feed 316 as shown in FIG. 3. Alternatively, the insulation layer 314 may be deposited on the additional piezoelectric material 402 as shown in FIG. 4. The insulation layer 314 may be conformally deposited, or may be deposited with a planar upper surface.

At operation 910, an outer electrode is conformally deposited exterior to the piezoelectric material in the active region and upon the insulating layer. For example, the outer electrode 302 forms the quadratic surface 206 in the active region 202 of the resonator 300 and the outer electrode feed 312 is formed of a portion of the outer electrode deposited upon the insulation layer 314. The outer electrode 302 may include multiple layers including one or more of an interface layer of high-impedance material, a current-carrying layer of low electrical resistance material, and an insulation layer for electrically and/or acoustically insulating the outer electrode from an outside environment.

CONCLUSION

Although the implementations of BAW resonators having an optimized outer perimeter have been described in language specific to structural features and/or methodological acts, it is to be understood that the implementations defined in the appended claims are not necessarily limited to the specific features or acts described. Rather, the specific features and acts are disclosed as example forms of implementing the claimed implementations.

What is claimed is:
1. A resonator comprising:
  an active region including:
    an outer electrode including a first convex portion along a quadratic surface;
    a piezoelectric layer including a second convex portion, the second convex portion disposed interior to the first convex portion; and
    an inner electrode including a third convex portion, the third convex portion disposed interior to the second convex portion; and
  a pedestal coupled to the active region at a connection region, the pedestal including:
    an outer electrode feed configured to couple the outer electrode to a first terminal; and
    an inner electrode feed configured to couple the inner electrode to a second terminal.
2. The resonator of claim 1, wherein:
  the first convex portion has one of a center of curvature or a focus; and
  the piezoelectric layer is disposed interior to the first convex portion in a volume between the first convex portion and the one of the center of curvature or the focus.
3. The resonator of claim 1, wherein the quadratic surface includes a truncated ellipsoid.
4. The resonator of claim 3, wherein the truncated ellipsoid includes a truncated surface at the connection region.
5. The resonator of claim 1, wherein the connection region is free of parallel edges.
6. The resonator of claim 1, wherein the outer electrode comprises a frame region circumscribing the connection region, the outer electrode having a thickness in the frame region that is greater than a thickness of the outer electrode outside of the frame region.

7. The resonator of claim 1, wherein the pedestal includes:
additional piezoelectric material adjacent to the inner electrode feed; and
an insulation layer between the additional piezoelectric material and the outer electrode feed.

8. The resonator of claim 1, wherein the piezoelectric layer is continuous and smooth within the active region.

9. The resonator of claim 1, wherein the active region includes one or more concave regions.

10. The resonator of claim 1, wherein the inner electrode fills the active region interior to the piezoelectric layer.

11. The resonator of claim 1, further comprising a dielectric material interior to the inner electrode.

12. The resonator of claim 1, further comprising one or more Bragg mirrors interior to the inner electrode.

13. The resonator of claim 1, wherein a thickness of the piezoelectric layer is substantially uniform in the active region.

14. A resonator comprising:
a truncated-ellipsoid-shaped active region, the active region including:
an outer electrode disposed as a first layer of the active region;
a piezoelectric layer disposed as a second layer of the active region, the piezoelectric layer disposed interior to the outer electrode;
an inner electrode disposed as a third layer of the active region, the inner electrode disposed interior to the piezoelectric layer; and
a Bragg mirror interior to the inner electrode, the Bragg mirror including alternating layers of high-impedance material and low-impedance material.

15. The resonator of claim 14, further comprising a pedestal disposed at a truncated surface of the active region, the pedestal providing structural support to the active region.

16. The resonator of claim 15, wherein the pedestal includes:
an outer electrode feed configured to couple the outer electrode to a first terminal; and
an inner electrode feed configured to couple the inner electrode to a second terminal.

17. The resonator of claim 16, wherein the pedestal further includes:
additional piezoelectric material between the outer electrode feed and the inner electrode feed; and
an insulation layer between the additional piezoelectric material and one of the outer electrode feed or the inner electrode feed.

18. The resonator of claim 14, wherein the outer electrode and the inner electrode include tungsten.

19. The resonator of claim 14, wherein the piezoelectric layer includes aluminum nitride.

20. A method for manufacturing a resonator, the method comprising:
forming a scaffold, the scaffold including a quadratic surface and a scaffold pedestal;
conformally depositing an inner electrode exterior to the scaffold, the inner electrode including an active region exterior to the quadratic surface and an inner electrode feed exterior to the scaffold pedestal;
conformally depositing a piezoelectric material on the inner electrode;
depositing an insulation layer exterior to the inner electrode feed; and
conformally depositing an outer electrode exterior to the piezoelectric material in the active region and exterior to the insulation layer.

21. The method of claim 20, further comprising forming a Bragg mirror on the quadratic surface, the Bragg mirror including alternating layers of high-impedance material and low-impedance material.

22. The method of claim 20, wherein:
the scaffold includes hydrophobic material; and
forming the scaffold includes applying heat to the scaffold to cause rounding of one or more edges of the hydrophobic material.

23. The method of claim 20, further comprising removing the piezoelectric material from the inner electrode feed.

24. The method of claim 20, further comprising removing at least a portion of the scaffold after conformally depositing the inner electrode upon the scaffold.

25. A resonator comprising:
a three-dimensional pill-shaped active region, the active region including:
a body portion that is generally cylinder-shaped;
an outer electrode disposed as a first layer of the active region;
a piezoelectric layer disposed as a second layer of the active region, the piezoelectric layer disposed interior to the outer electrode;
an inner electrode disposed as a third layer of the active region, the inner electrode disposed interior to the piezoelectric layer;
a first pedestal coupled to the body portion, the first pedestal including:
a first pedestal outer layer configured to couple the outer electrode to a first electrode feed; and
a first pedestal inner layer configured to couple the inner electrode to a second electrode feed; and
a second pedestal coupled to the body portion and spaced longitudinally from the first pedestal, the second pedestal providing structural support to the body portion.

26. The resonator of claim 25, wherein the active region includes:
a body portion that is generally cylinder-shaped;
a first truncated sphere at a first longitudinal end of the body portion; and
a second truncated sphere at a second longitudinal end of the body portion.

27. The resonator of claim 26, wherein the body portion includes alternating concave and convex regions between the first truncated sphere and the second truncated sphere.

* * * * *